United States Patent
Yu et al.

(10) Patent No.: US 10,504,810 B2
(45) Date of Patent: Dec. 10, 2019

(54) POLYMER-BASED-SEMICONDUCTOR STRUCTURE WITH CAVITY

(71) Applicant: Taiwan Semiconductor Manufacturing Company, Ltd., Hsinchu (TW)

(72) Inventors: Chen-Hua Yu, Hsinchu (TW); Hung-Yi Kuo, Taipei (TW); Hao-Yi Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/958,812

(22) Filed: Apr. 20, 2018

(65) Prior Publication Data
US 2018/0240724 A1   Aug. 23, 2018

Related U.S. Application Data

(62) Division of application No. 15/144,262, filed on May 2, 2016, now Pat. No. 9,953,892.
(Continued)

(51) Int. Cl.
| | |
|---|---|
| *H01L 23/48* | (2006.01) |
| *H01L 23/52* | (2006.01) |
| *H01L 23/31* | (2006.01) |
| *H01L 23/498* | (2006.01) |
| *H01L 21/48* | (2006.01) |
| *H01L 23/64* | (2006.01) |

(Continued)

(52) U.S. Cl.
CPC ........ *H01L 23/315* (2013.01); *H01L 21/4857* (2013.01); *H01L 23/49811* (2013.01); *H01L 23/49816* (2013.01); *H01L 23/49822* (2013.01); *H01L 23/645* (2013.01); *H01L 24/19* (2013.01); *H01L 24/20* (2013.01); *H01L 21/568* (2013.01); *H01L 23/3128* (2013.01); *H01L 23/485* (2013.01); *H01L 28/10* (2013.01); *H01L 2224/04105* (2013.01); *H01L 2224/12105* (2013.01); *H01L 2224/16227* (2013.01); *H01L 2224/18* (2013.01); *H01L 2224/24195* (2013.01); *H01L 2224/32225* (2013.01); *H01L 2224/73267* (2013.01); *H01L 2224/92244* (2013.01); *H01L 2924/19105* (2013.01)

(58) Field of Classification Search
CPC ............ H01L 23/49811; H01L 21/563; H01L 23/49827; H01L 21/56; H01L 23/315; H01L 23/485; H01L 23/5226
USPC ........................................................ 257/779
See application file for complete search history.

(56) References Cited

U.S. PATENT DOCUMENTS

| | | |
|---|---|---|
| 8,361,842 B2 | 1/2013 | Yu et al. |
| 8,618,631 B2 | 12/2013 | Jin et al. |

(Continued)

FOREIGN PATENT DOCUMENTS

| | | |
|---|---|---|
| CN | 102541120 A | 7/2012 |
| CN | 103247596 A | 8/2013 |

(Continued)

*Primary Examiner* — Theresa T Doan
(74) *Attorney, Agent, or Firm* — Slater Matsil, LLP

(57) ABSTRACT

A structure includes a device die, and an encapsulating material encapsulating the device die therein. The encapsulating material has a top surface coplanar with a top surface of the device die, and a cavity in the encapsulating material. The cavity penetrates through the encapsulating material.

20 Claims, 22 Drawing Sheets

Related U.S. Application Data

(60) Provisional application No. 62/250,807, filed on Nov. 4, 2015.

(51) Int. Cl.
  *H01L 23/00* (2006.01)
  *H01L 23/485* (2006.01)
  *H01L 49/02* (2006.01)
  *H01L 21/56* (2006.01)

(56) References Cited

U.S. PATENT DOCUMENTS

| | | |
|---|---|---|
| 8,669,655 B2 | 3/2014 | Geitner et al. |
| 8,680,647 B2 | 3/2014 | Yu et al. |
| 8,692,349 B2 | 4/2014 | Kim et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,253,386 B2 | 2/2016 | Miyazaki et al. |
| 9,343,442 B2 | 5/2016 | Chen et al. |
| 2008/0237828 A1 | 10/2008 | Yang |
| 2009/0262226 A1 | 10/2009 | Lee et al. |
| 2011/0291288 A1 | 12/2011 | Wu et al. |
| 2012/0025356 A1 | 2/2012 | Liao et al. |
| 2013/0020468 A1* | 1/2013 | Mitsuhashi ....... H01L 27/14627 250/208.1 |
| 2013/0020469 A1 | 1/2013 | Mitsuhashi et al. |
| 2013/0026468 A1 | 1/2013 | Yoshimuta et al. |
| 2013/0037950 A1 | 2/2013 | Yu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0207230 A1 | 8/2013 | Jin et al. |
| 2013/0307140 A1 | 11/2013 | Huang et al. |
| 2014/0035154 A1 | 2/2014 | Geitner et al. |
| 2014/0124475 A1* | 5/2014 | Lee ................ H05K 3/0097 216/18 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0187710 A1 | 7/2015 | Scanlan et al. |

FOREIGN PATENT DOCUMENTS

| | | |
|---|---|---|
| CN | 103579190 A | 2/2014 |
| CN | 103681561 A | 3/2014 |
| CN | 104038680 A | 9/2014 |
| JP | 2002164660 A | 6/2002 |
| KR | 20140038283 A | 3/2014 |
| TW | 201208033 A | 2/2012 |
| WO | 2015137936 A1 | 9/2015 |

* cited by examiner

POLYMER-BASED-SEMICONDUCTOR STRUCTURE WITH CAVITY

PRIORITY CLAIM AND CROSS-REFERENCE

This application is a divisional of U.S. application Ser. No. 15/144,262, entitled "Polymer-Based-Semiconductor Structure with Cavity," filed May 2, 2016, which claims the benefit of the following provisionally filed U.S. Patent application: Application Ser. No. 62/250,807, entitled "Epoxy-Based Semiconductor Structure with Hole or Cavity," filed Nov. 4, 2015, which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to the region directly over the surface of the respective die. With the limited areas of the dies, the number of the I/O pads is limited due to the limitation of the pitch of the I/O pads. If the pitch of the pads is to be decreased, solder regions may bridge with each other, causing circuit failure. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
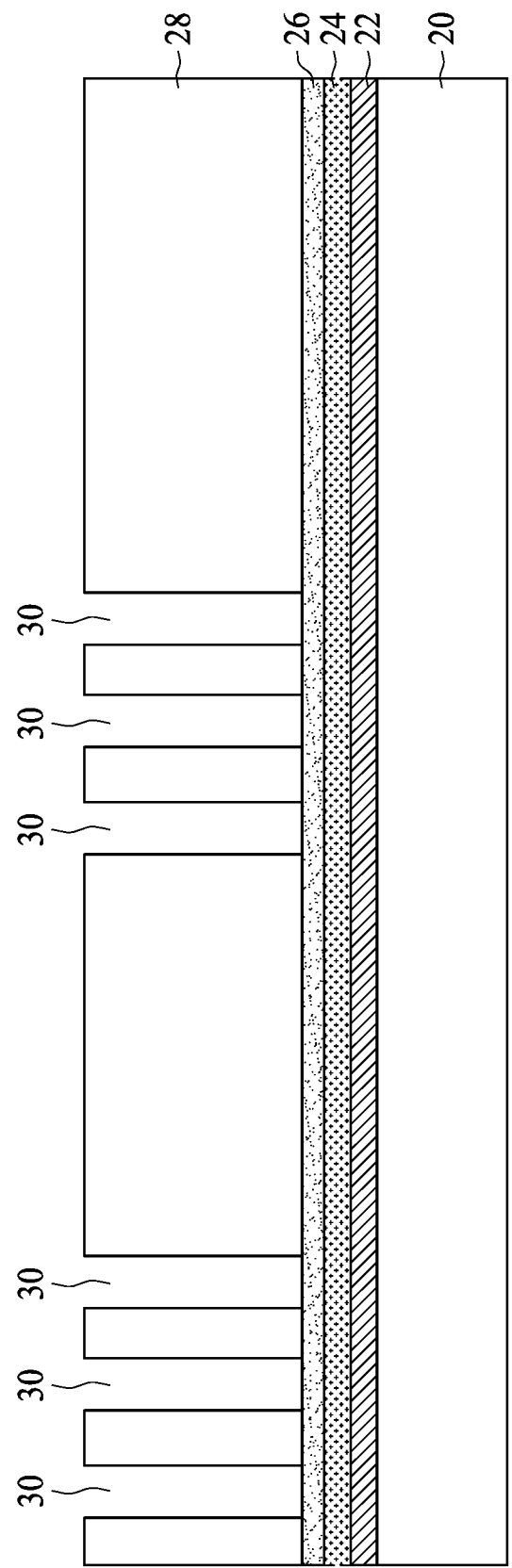
FIGS. 1 through 17 illustrate the cross-sectional views of intermediate stages in the formation of some packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package having a cavity, which may penetrate through an encapsulating material of the respective package and the method of forming the package are provided in accordance with various exemplary embodiments. The intermediate stages of forming the package are illustrated. Some variations of some embodiments are discussed. Throughout the various views and illustrative embodiments, like reference numbers are used to designate like elements.

Figure 20:
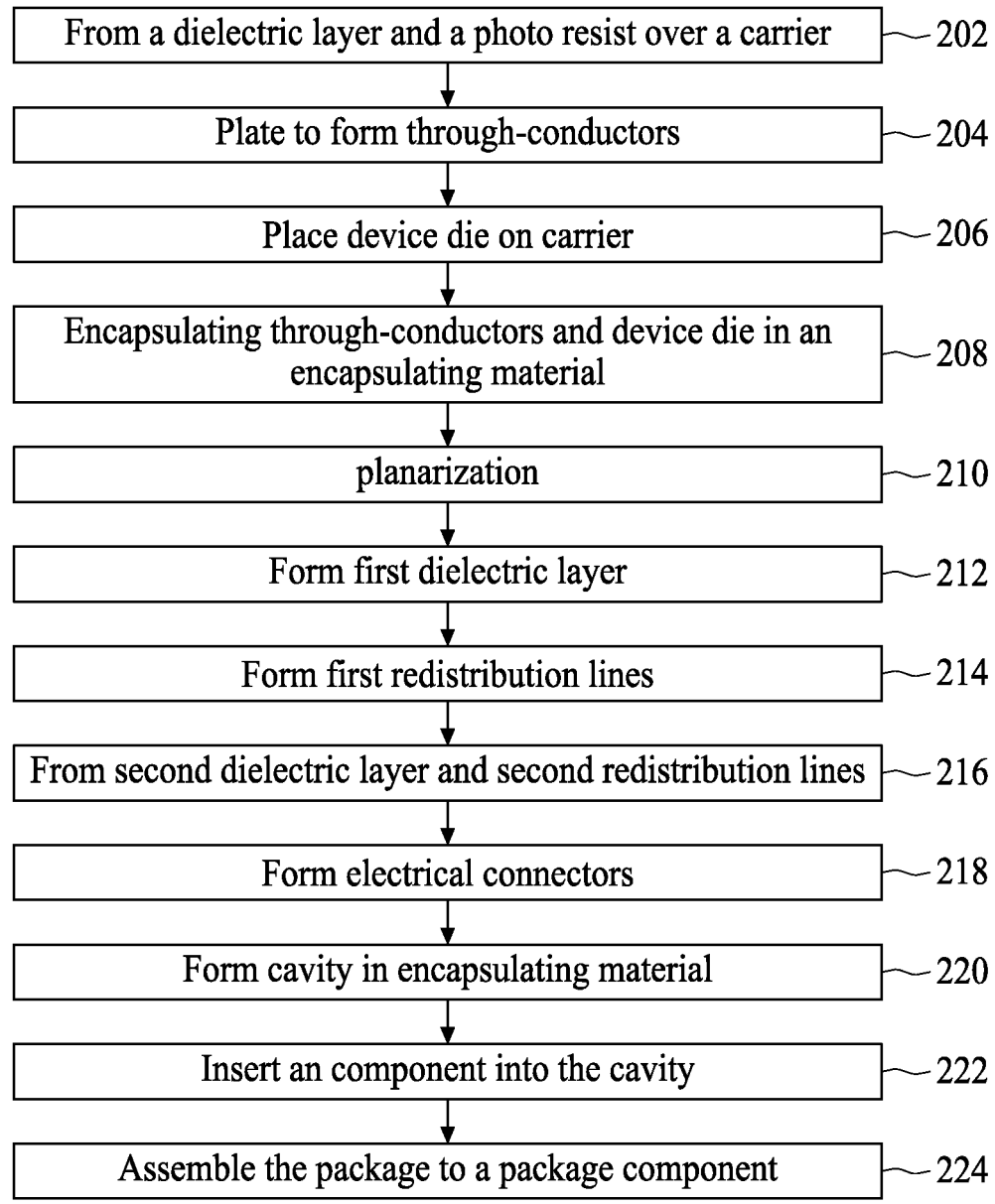
FIG. 20 illustrates a process flow for forming a package in accordance with some embodiments.

FIGS. 1 through 17 illustrate the cross-sectional views and top views of intermediate stages in the formation of some packages in accordance with some embodiments of the present disclosure. The steps shown in FIG. 1 through 17 are also schematically illustrated in the process flow 200 shown in FIG. 20.

FIG. 1 illustrates carrier 20 and release layer 22 formed over carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. In accordance with some embodiments of the present disclosure, release layer 22 is formed of an ultra-violet (UV) glue. Release layer 22 may be dispensed as a liquid and cured. In accordance with alternative embodiments of the present disclosure, release layer 22 is a laminate film and is laminated onto carrier 20. The top surface of release layer 22 is leveled and has a high degree of co-planarity.

In accordance with some embodiments of the present disclosure, dielectric layer 24 is formed over release layer 22. The respective step is shown as step 202 in the process flow shown in FIG. 20. In the final product, dielectric layer 24 may be used as a passivation layer to isolate the overlying metallic features from the adverse effect of moisture and other detrimental substances. Dielectric layer 24 may be formed of a polymer, which may also be a photo-sensitive material such as polybenzoxazole (PBO), polyimide, benzocyclobutene (BCB), or the like. In accordance with alternative embodiments of the present disclosure, dielectric layer 24 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like. In accordance with yet alternative embodiments of the present disclosure, no dielectric layer 24 is formed. Accordingly, dielectric layer 24 is shown with dashed lines to indicate that it may or may not be formed.

Figure 2:
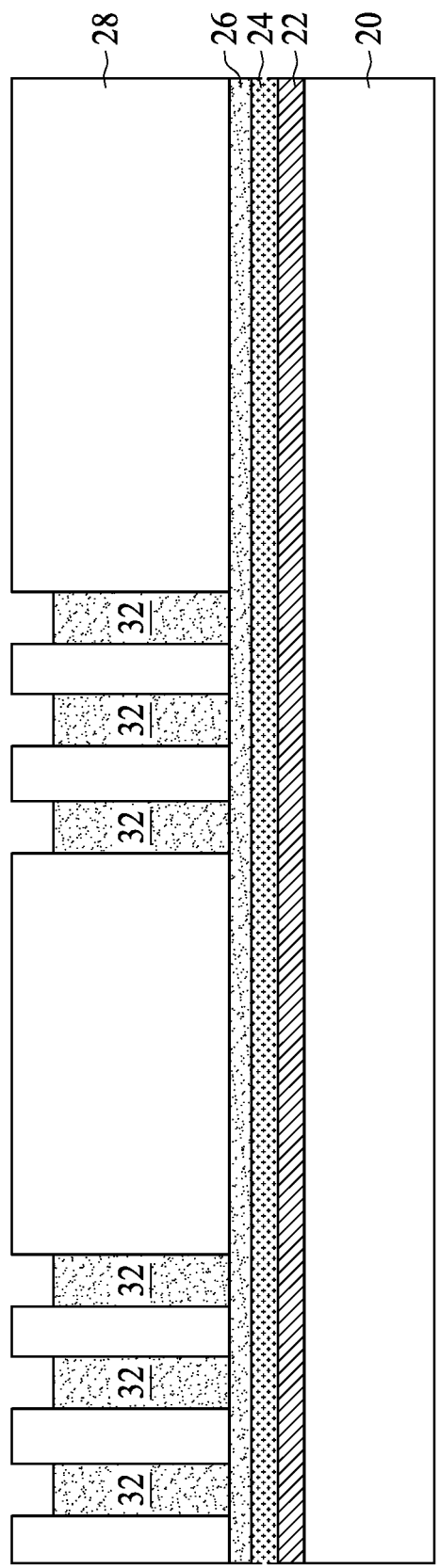
Figure 3:
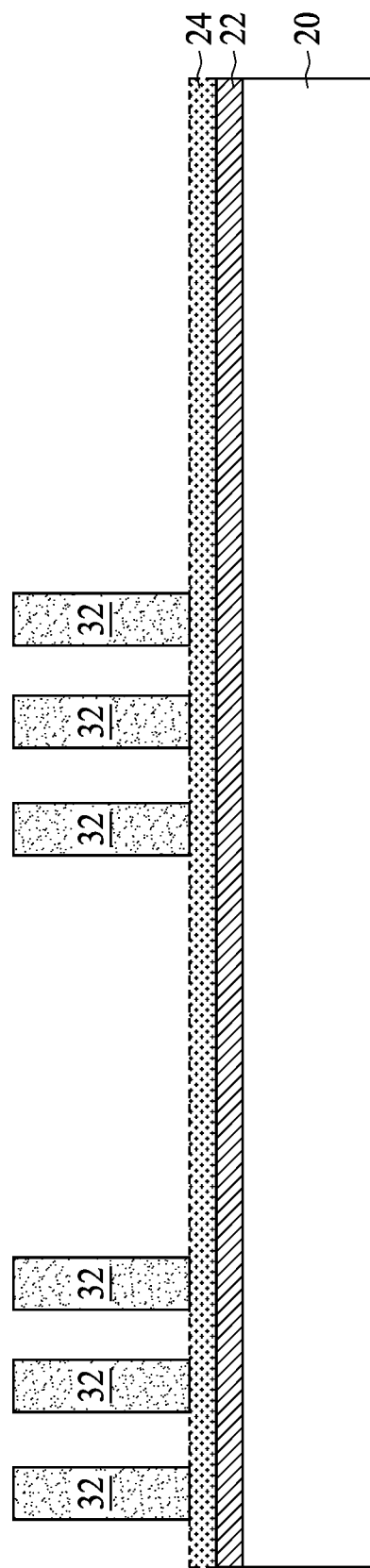

FIGS. 2 and 3 illustrate the formation of conductive features 32, which are referred to as through-conductors hereinafter since they penetrate the encapsulation material 52 (FIG. 6) that will be applied in subsequent steps. Referring to FIG. 2, seed layer 26 is formed over dielectric layer 24, for example, through Physical Vapor Deposition (PVD) or metal foil lamination. Seed layer 26 may be formed of copper, aluminum, titanium, or multi-layers thereof. In accordance with some embodiments of the present disclosure, seed layer 26 includes a titanium layer (not shown) and a copper layer (not shown) over the titanium layer. In accordance with alternative embodiments, seed layer 26 includes a single copper layer.

Photo resist 28 is applied over seed layer 26 and is then patterned. The respective step is also shown as step 202 in the process flow shown in FIG. 20. As a result, openings 30 are formed in photo resist 28, through which some portions of seed layer 26 are exposed.

As shown in FIG. 2, through-conductors 32 are formed in openings 30 through plating, which may be electro plating or electro-less plating. The respective step is shown as step 204 in the process flow shown in FIG. 20. Through-conductors 32 are plated on the exposed portions of seed layer 26. Through-conductors 32 may include copper, aluminum, tungsten, nickel, or alloys thereof. The top-view shapes of through-conductors 32 include, and are not limited to, spirals, rings, rectangles, squares, circles, and the like, depending on the intended function of through-conductors 32. The heights of through-conductors 32 are determined by the thickness of the subsequently placed device die 38 (FIG. 3), with the heights of through-conductors 32 being greater than or equal to the thickness of device die 38 in accordance with various embodiments.

After the plating of through-conductors 32, photo resist 28 is removed, and the resulting structure is shown in FIG. 3. The portions of seed layer 26 (FIG. 2) that were previously covered by photo resist 28 are exposed. An etch step is then performed to remove the exposed portions of seed layer 26, wherein the etching may be an anisotropic or isotropic etching. The portions of seed layer 26 that are overlapped by through-conductors 32, on the other hand, remain not etched. Throughout the description, the remaining underlying portions of seed layer 26 are considered as the bottom portions of through-conductors 32. When seed layer 26 is formed of a material similar to or the same as that of the respective overlying through-conductors 32, seed layer 26 may be merged with through-conductors 32 with no distinguishable interface therebetween. Accordingly, seed layers 26 are not shown in subsequent drawings. In accordance with alternative embodiments of the present disclosure, there exist distinguishable interfaces between seed layer 26 and the overlying plated portions of through-conductors 32.

Figure 19A:
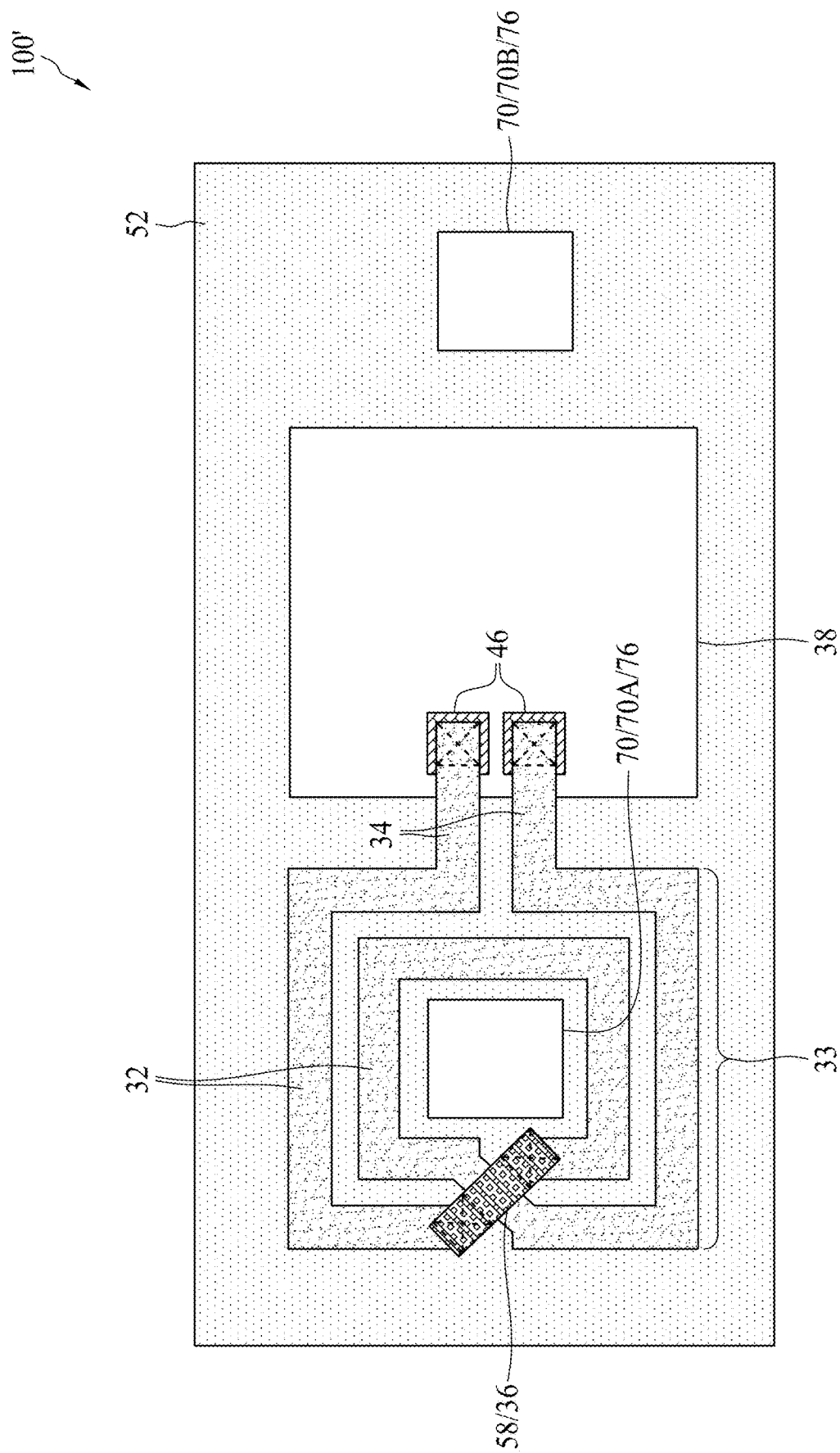
FIGS. 19A and 19B illustrate the top views of some packages in accordance with some embodiments.
Figure 19B:
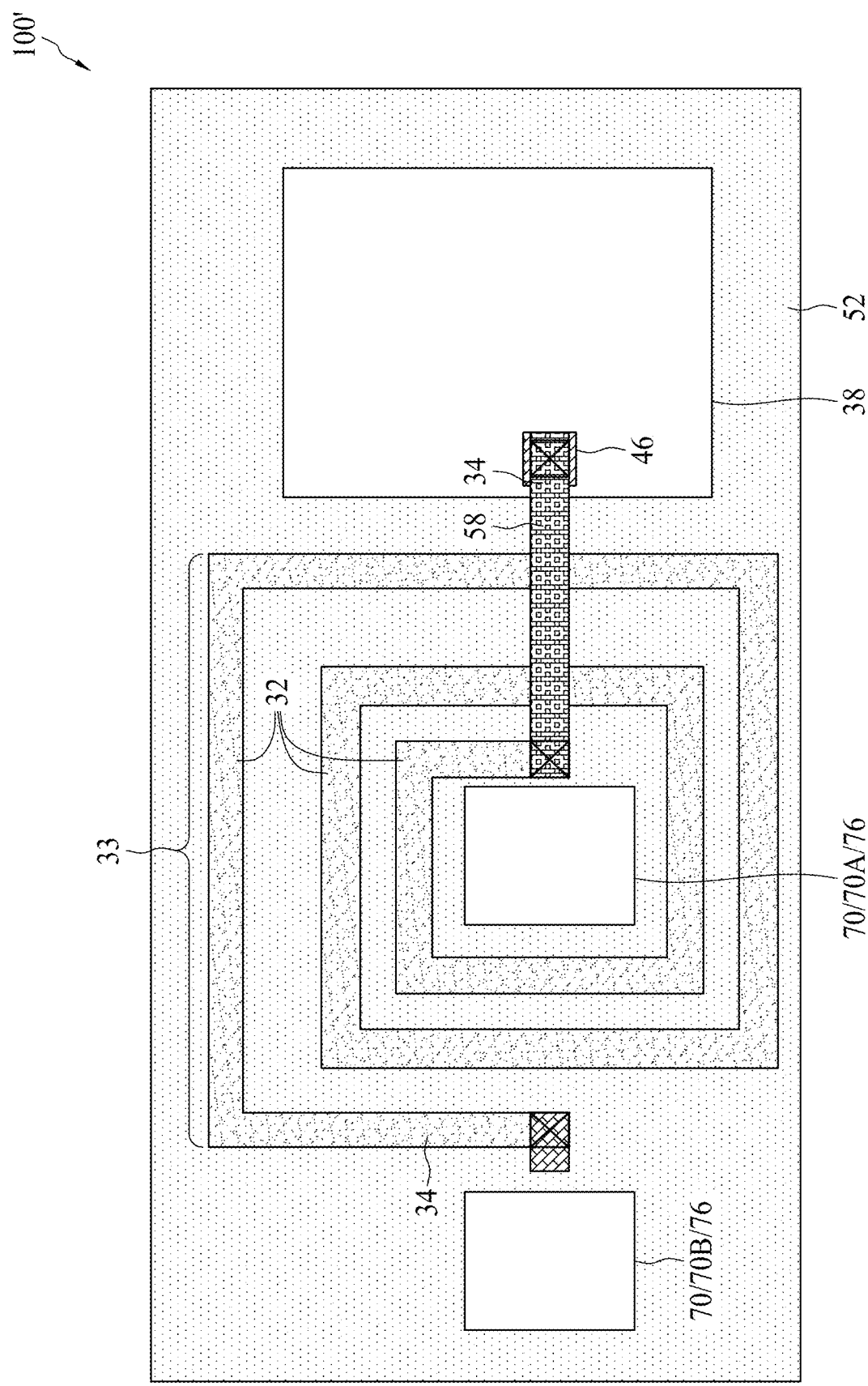

The top-view shape of through-conductors 32 is related to, and is determined by, their intended function. In accordance with some exemplary embodiments in which through-conductors 32 are used to form an inductor, the illustrated through-conductors 32 may be a part of a coil. FIGS. 19A and 19B illustrate the top views of some inductors in accordance with some exemplary embodiments. In FIG. 19A, through-conductors 32 form a plurality of concentric rings, with the outer rings encircling the inner rings. The rings have breaks to allow the outer rings to be connected to the inner rings through bridges 36, and the plurality of rings is serially connected to two ports 34. In FIG. 19B, through-conductors 32 are portions of an integrated spiral, which also have ports 34. Although FIG. 19B illustrates that the left port 34 is disconnected from device die 38, the left port 34 may also be connected to device die 38 in accordance with some embodiments.

Figure 4:
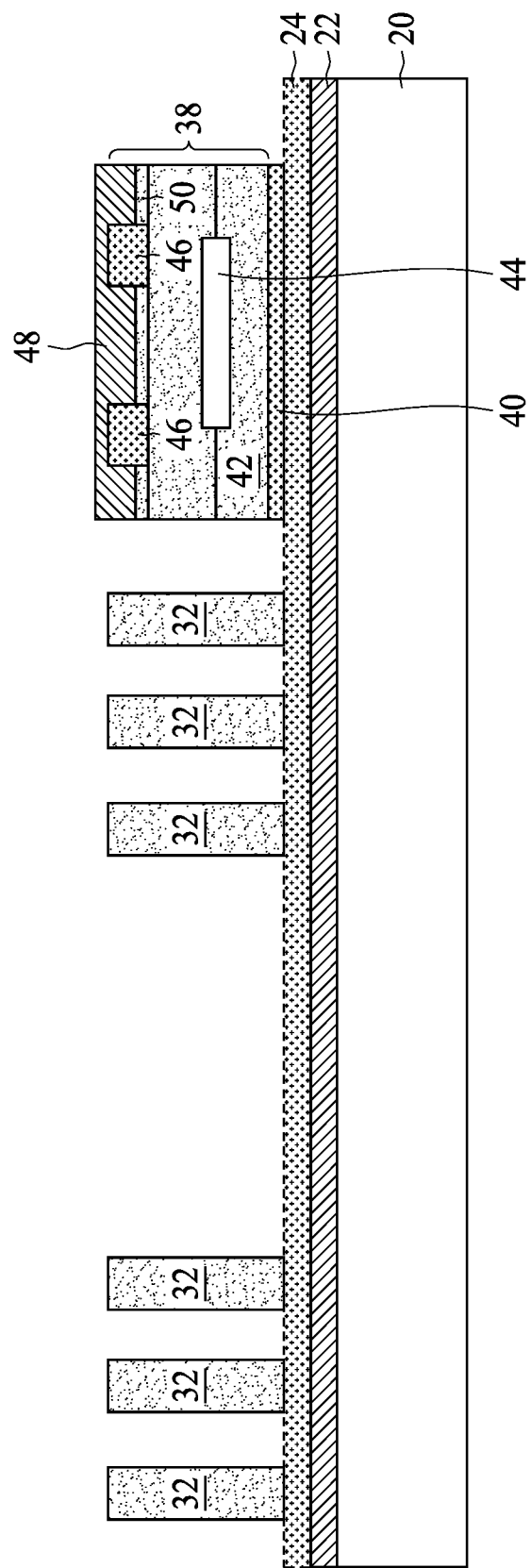

FIG. 4 illustrates the placement of device die 38 over carrier 20. The respective step is shown as step 206 in the process flow shown in FIG. 20. Device die 38 may be adhered to dielectric layer 24 through Die-Attach Film (DAF) 40, which is an adhesive film. In accordance with some embodiments of the present disclosure, device die 38 is a Central Processing Unit (CPU) die, a Micro Control Unit (MCU) die, an Input-output (IO) die, a BaseBand (BB) die, or an Application Processor (AP) die. Although one device die 38 is illustrated, more device dies may be placed over dielectric layer 24. In accordance with some embodiments of the present disclosure, the formation of the package is at wafer-level. Accordingly, a plurality of device dies identical to device die 38 may be placed on carrier 20, and is allocated as an array having a plurality of rows and columns.

Device die 38 may include semiconductor substrate 42, which may be a silicon substrate. Integrated circuit devices 44 are formed on semiconductor substrate 42. Integrated circuit devices 44 may include active devices such as transistors and diodes and/or passive devices such as resistors, capacitors, inductors, or the like. Device die 38 may include metal pillars 46 electrically coupled to integrated circuit devices 44. Metal pillars 46 may be embedded in dielectric layer 48, which may be formed of PBO, polyimide, or BCB, for example. Passivation layer 50 is also illustrated, wherein metal pillars 46 may extend into passivation layer 50. Passivation layer 50 may include silicon nitride, silicon oxide, or multi-layers thereof.

Figure 5:
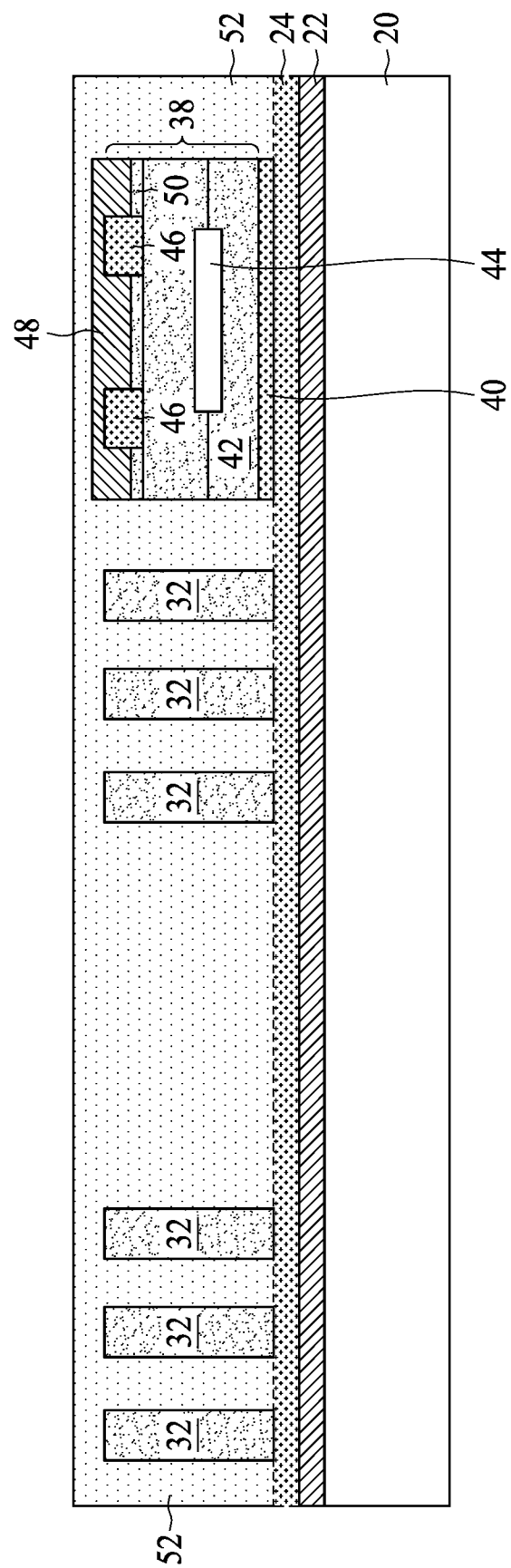

Next, referring to FIG. 5, encapsulating material 52 is encapsulated/molded on device die 38. The respective step is shown as step 208 in the process flow shown in FIG. 20. Encapsulating material 52 fills the gaps between neighboring through-conductors 32 and the gaps between through-conductors 32 and device die 38. Encapsulating material 52 may include a polymer-based material, and may include a molding compound, a molding underfill, an epoxy, and/or a resin. The top surface of encapsulating material 52 is higher than the top ends of metal pillar 46.

Figure 6:
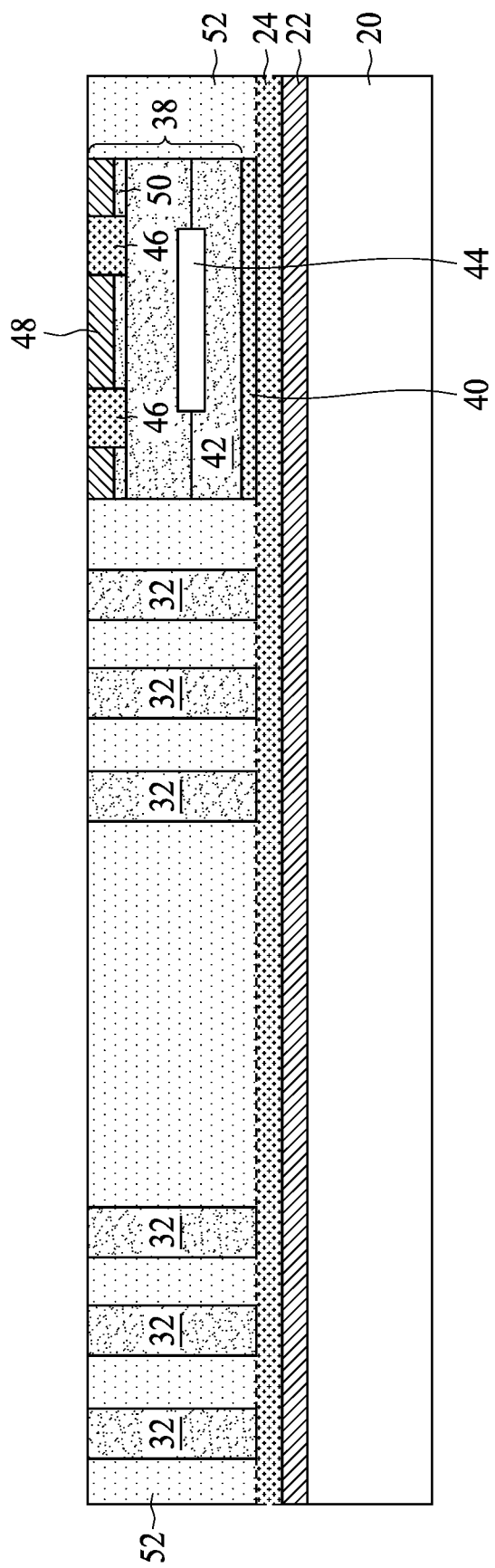

In a subsequent step, as shown in FIG. 6, a planarization process such as a Chemical Mechanical Polish (CMP) process or a grinding process is performed to reduce the top surface of encapsulating material 52, until through-conductors 32 and metal pillar 46 are exposed. The respective step is also shown as step 210 in the process flow shown in FIG. 20. Due to the planarization, the top ends of through-conductors 32 are substantially level (coplanar) with the top surfaces of metal pillars 46, and are substantially coplanar with the top surface of encapsulating material 52.

In the exemplary process steps as discussed above, through-conductors 32 are formed to penetrate through encapsulating material 52. Furthermore, through-conductors 32 are coplanar with device die 38. In accordance with some other embodiments of the present disclosure, no through-conductor is formed to penetrate through encapsulating material 52.

Figure 7:
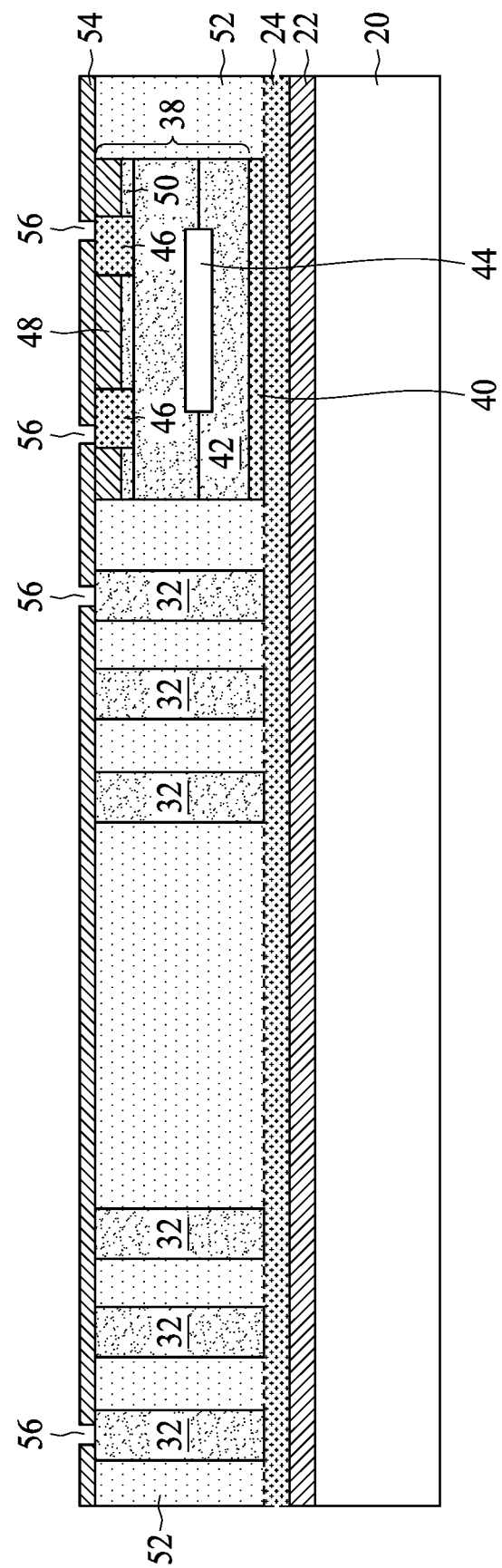

FIGS. 7 through 11 illustrate the formation of front-side RDLs and the respective dielectric layers. Referring to FIG. 7, dielectric layer 54 is formed. The respective step is shown as step 212 in the process flow shown in FIG. 20. In accordance with some embodiments of the present disclosure, dielectric layer 54 is formed of a polymer such as PBO, polyimide, or the like. In accordance with alternative embodiments of the present disclosure, dielectric layer 54 is formed of an inorganic material such as silicon nitride, silicon oxide, or the like. Openings 56 are formed in dielectric layer 54 (for example, through exposure and development) to expose through-conductors 32 and metal pillars 46. Openings 56 may be formed through a photo lithography process.

Figure 8:
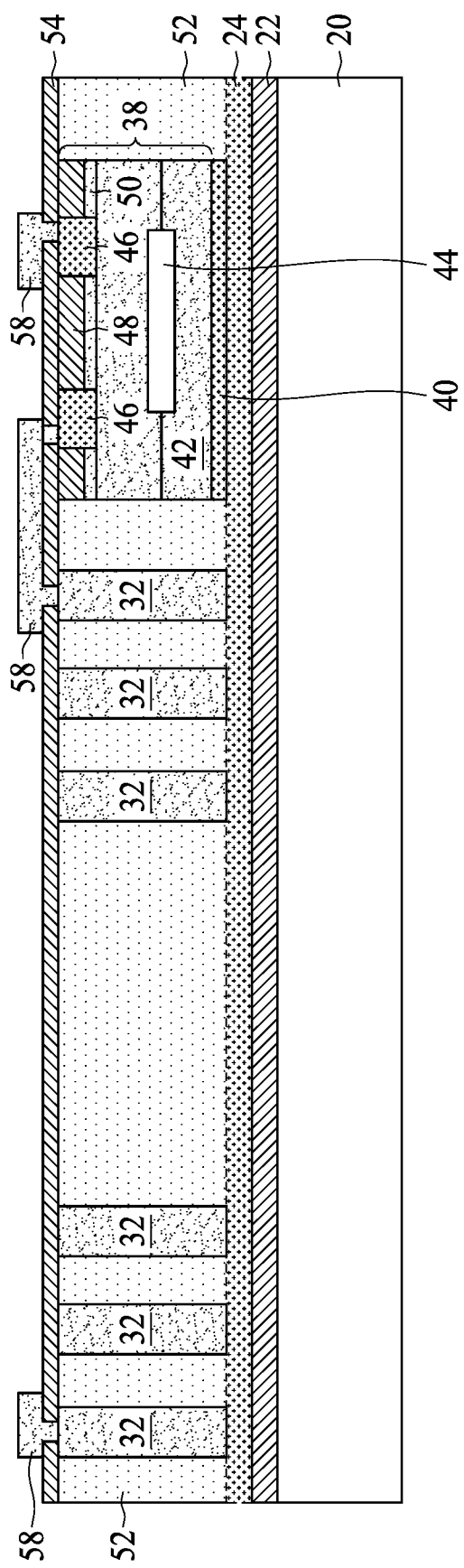

Next, referring to FIG. 8, Redistribution Lines (RDLs) 58 are formed to connect to metal pillars 46 and through-conductors 32. The respective step is shown as step 214 in the process flow shown in FIG. 20. RDLs 58 may also interconnect metal pillars 46 and through-conductors 32. In addition, RDLs 58 may be used to form bridge 36 (FIG. 19A) of inductor 33. RDLs 58 include metal traces (metal lines) over dielectric layer 54 and vias extending into dielectric layer 54. The vias in RDLs 58 are connected to through-conductors 32 and metal pillars 46. In accordance with some embodiments of the present disclosure, the formation of RDLs 58 includes forming a blanket copper seed layer, forming and patterning a mask layer over the blanket copper seed layer, performing a plating to form RDLs 58, removing the mask layer, and etch the portions of the blanket copper seed layer not covered by RDLs 58. RDLs 58 may be formed of a metal or a metal alloy including aluminum, copper, tungsten, and/or alloys thereof.

Figure 9:
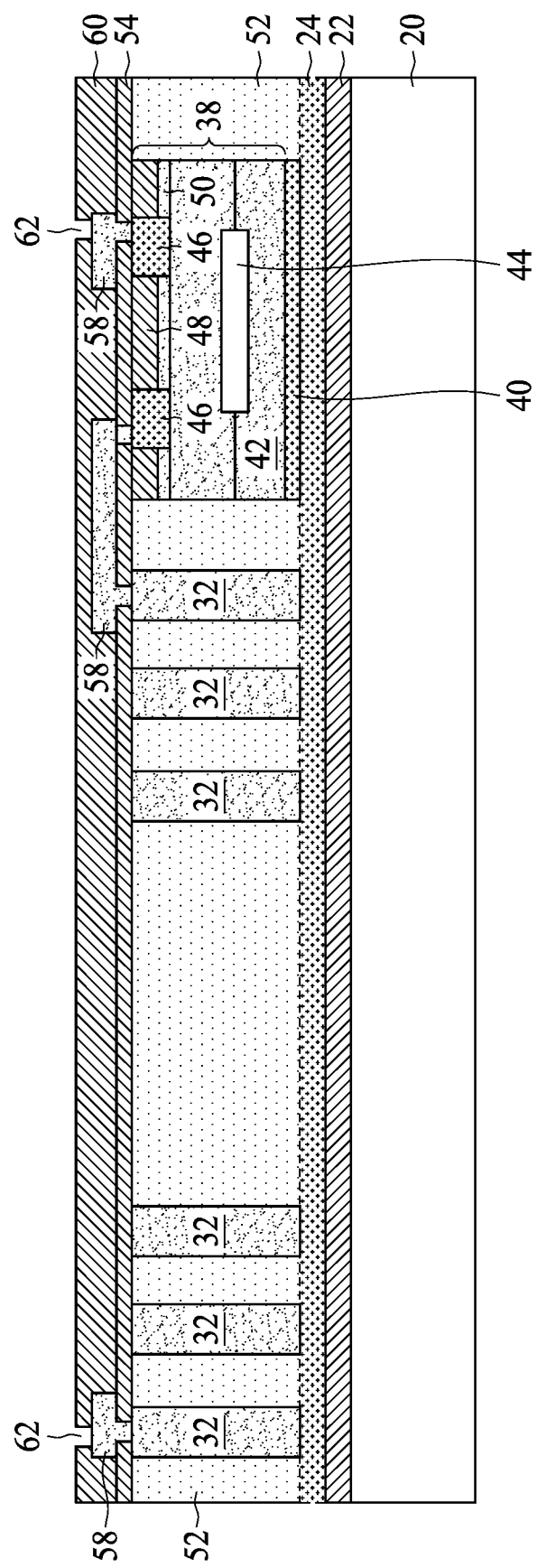

Referring to FIG. 9, in accordance with some embodiments, dielectric layer 60 is formed over the structure shown in FIG. 8, followed by the formation of openings 62 in dielectric layer 60. Some portions of RDLs 58 are thus exposed. The respective step is shown as step 216 in the process flow shown in FIG. 20. Dielectric layer 60 may be formed using a material selected from the same candidate materials for forming dielectric layer 54.

Figure 10:
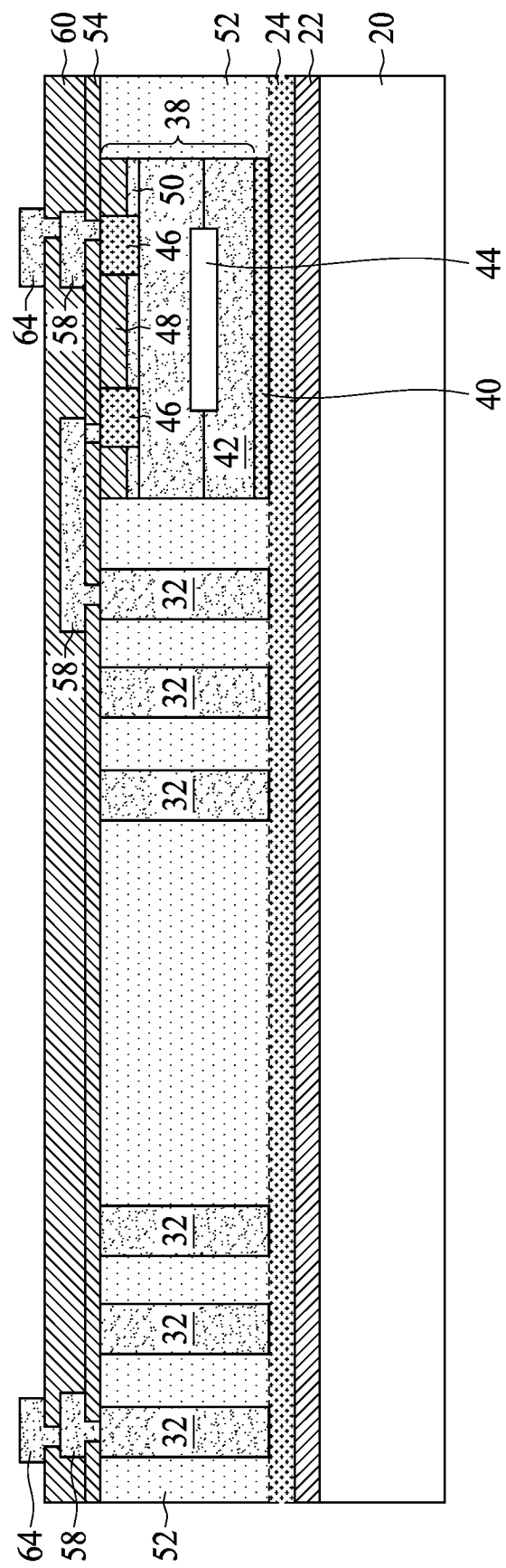

Next, as shown in FIG. 10, RDLs 64 are formed in dielectric layer 60. The respective step is also shown as step 216 in the process flow shown in FIG. 20. In accordance with some embodiments of the present disclosure, the formation of RDLs 64 includes forming a blanket copper seed layer, forming and patterning a mask layer over the blanket copper seed layer, performing a plating to form RDLs 64, removing the mask layer, and etching the portions of the blanket copper seed layer not covered by RDLs 64. RDLs 64 may also be formed of a metal or a metal alloy including aluminum, copper, tungsten, and/or alloys thereof. It is appreciated that although in the illustrated exemplary embodiments, two layers of RDLs (58 and 64) are formed, the RDLs may have any number of layers such as one layer or more than two layers.

Figure 11:
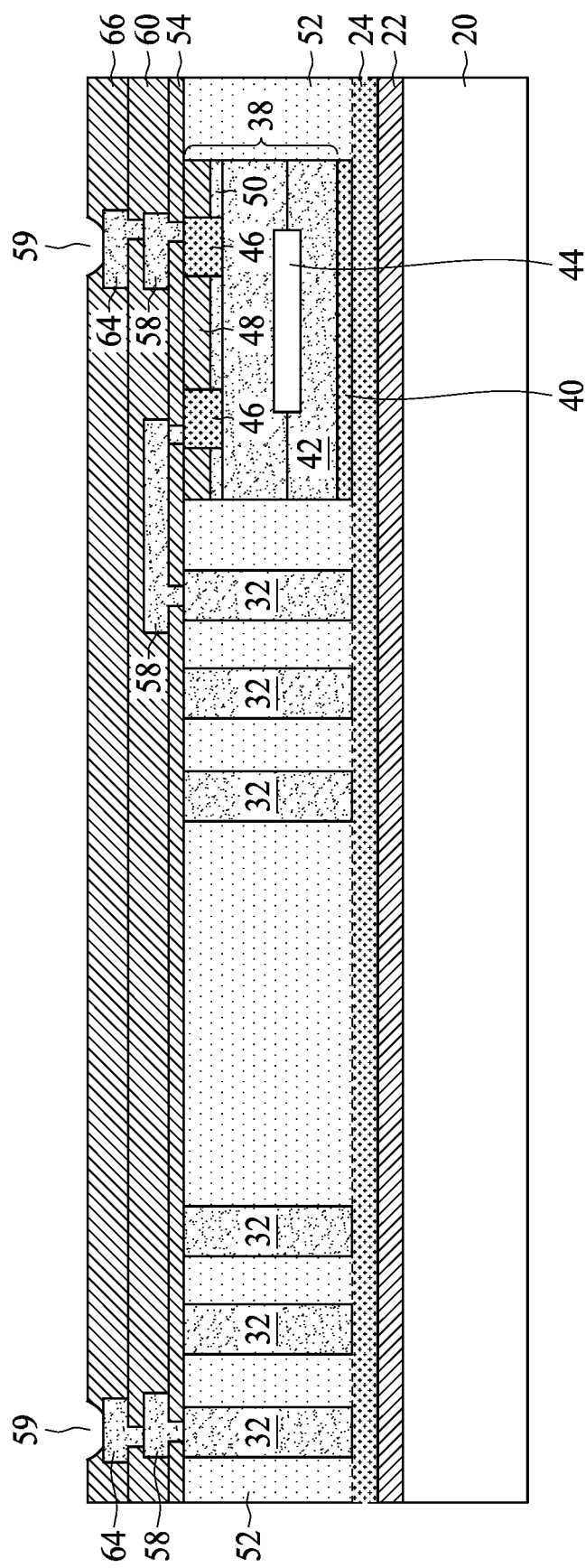
Figure 12:
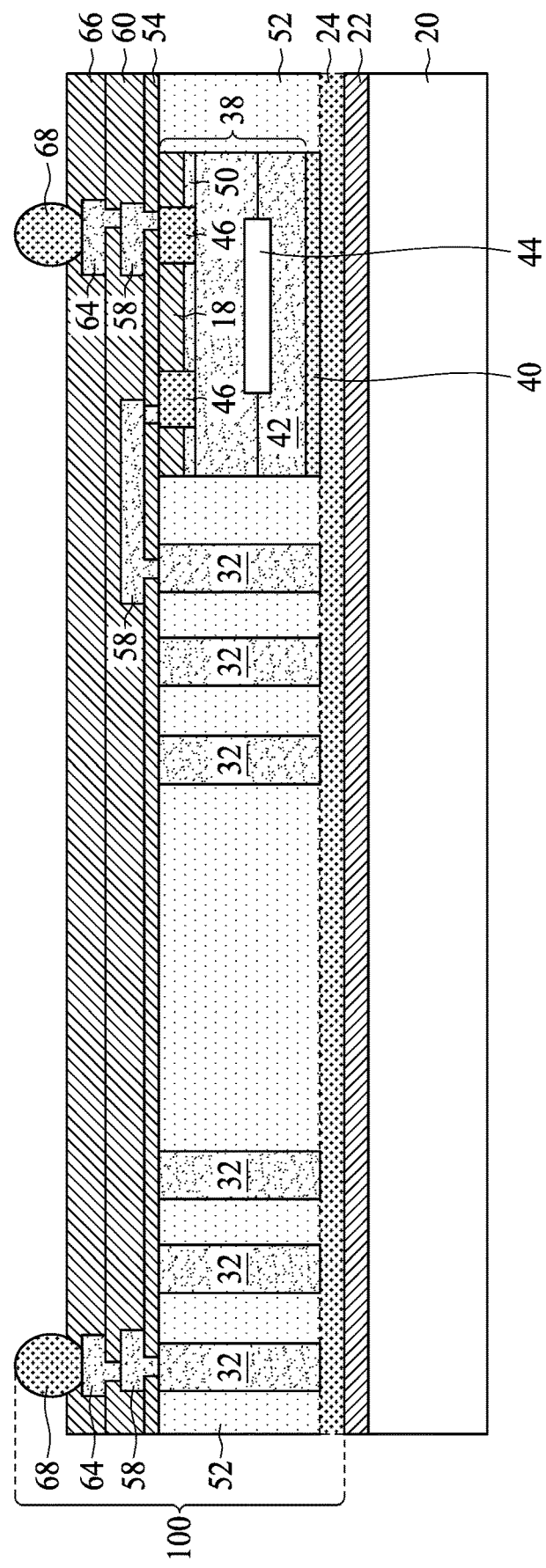

FIGS. 11 and 12 illustrate the formation of dielectric layer 66 and electrical connectors 68 in accordance with some exemplary embodiments. The respective step is shown as step 218 in the process flow shown in FIG. 20. Referring to FIG. 11, dielectric layer 66 is formed, for example, using PBO, polyimide, or BCB. Openings 59 are formed in dielectric layer 66 to expose the underlying metal pads, which are parts of RDLs 64. In accordance with some embodiment, Under-Bump Metallurgies (UBMs, not shown) are formed to extend into opening 59 in dielectric layer 66.

Electrical connectors 68 are then formed, as shown in FIG. 12. The formation of electrical connectors 68 may include placing solder balls on the exposed portions of the UBMs, and then reflowing the solder balls. In accordance with alternative embodiments of the present disclosure, the formation of electrical connectors 68 includes performing a plating step to form solder regions over the exposed metal pads in RDLs 64, and then reflowing the solder regions. Electrical connectors 68 may also include metal pillars, or metal pillars and solder caps, which may also be formed through plating. Throughout the description, the structure including dielectric layer 24 and the overlying structure in combination is referred to as package 100, which is a composite wafer including a plurality of device dies 38.

Figure 13:
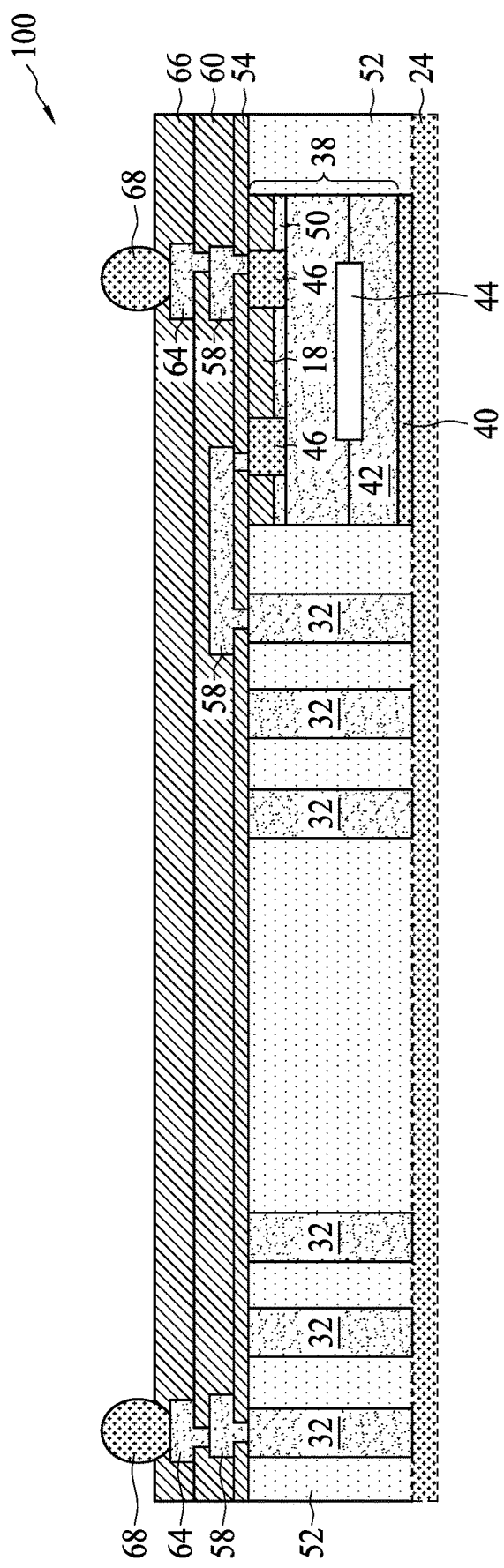

Next, package 100 is de-bonded from carrier 20, for example, by projecting a UV light or a laser beam on release layer 22, so that release layer 22 decomposes under the heat of the UV light or the laser beam. Package 100 is thus de-bonded from carrier 20. The resulting package 100 is shown in FIG. 13. In accordance with some embodiments of the present disclosure, in the resultant package 100, dielectric layer 24 remains as a bottom part of package 100, and protects through-conductors 32. Dielectric layer 24 may be a blanket layer with no through-opening therein. In accordance with alternative embodiments, dielectric layer 24 is not formed, and the bottom surfaces of encapsulating material 52 and through-conductors 32 are exposed after the de-bonding. A backside grinding may (or may not) be performed to remove DAF 40, if it is used, so that the bottom surfaces of through-conductors 32 are coplanar with the bottom surface of device die 38. The bottom surface of device die 38 may also be the bottom surface of semiconductor substrate 42.

Figure 14A:
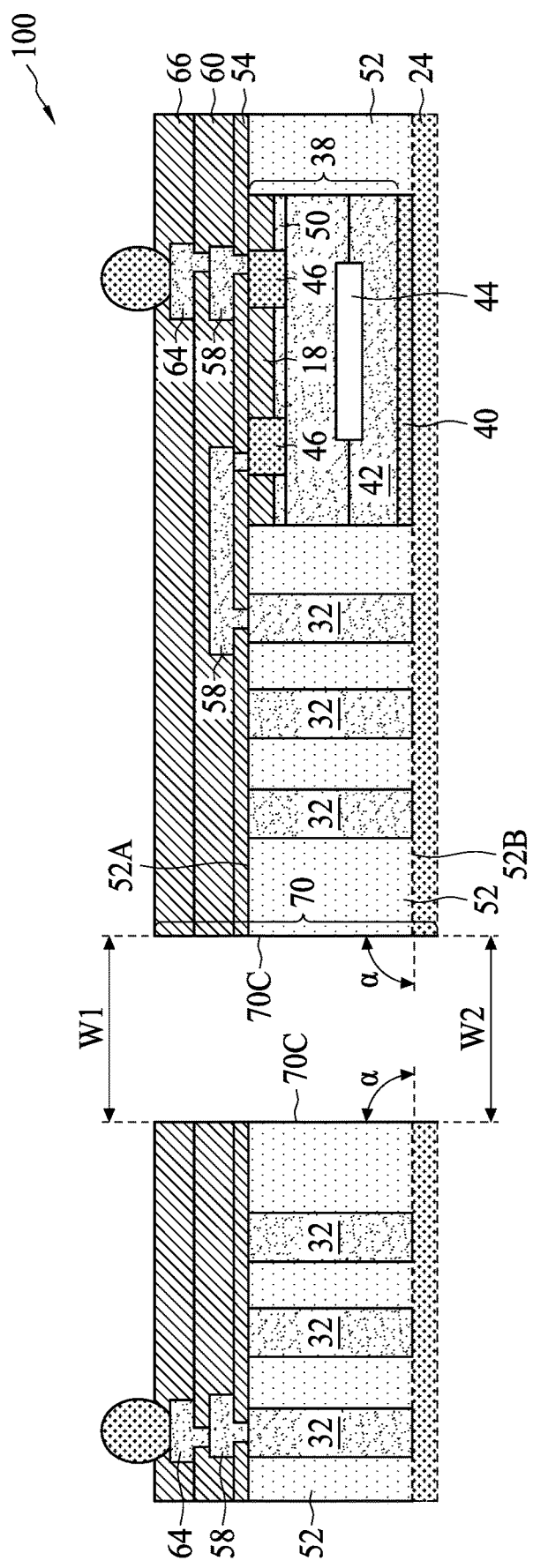

In a subsequent step, as shown in FIG. 14A, cavity 70 is formed. The respective step is shown as step 220 in the process flow shown in FIG. 20. In accordance with some embodiments of the present disclosure, cavity 70 is formed by laser drilling. In accordance with alternative embodiments, cavity 70 is formed by drilling using a drill bit. In accordance with yet other embodiments of the present disclosure, cavity 70 is formed by cutting using a blade. Accordingly, the top-view shape of cavity 70 may be a circular shape, a rectangular (such as a square) shape, a polygon, or another shape, depending on the intended usage of cavity 70, as will be discussed in subsequent steps. Since cavity 70 may be formed using laser, drill bit, or blade, the sidewalls 70C of cavity may be vertical, and the top dimension W1 is equal to bottom dimension W2. In accordance with alternative embodiments, sidewalls 70C are straight and slanted, for example, with slant angle $\alpha$ in the range between about 45 degrees and about 135 degrees. Accordingly, top dimension W1 may be greater than or smaller than bottom dimension W2. The optimal slant angle $\alpha$ and the optimal widths W1 and W2 are determined by the shape and the size of the component that will be placed in cavity 70 in subsequent steps.

In accordance with some exemplary embodiments of the present disclosure, as shown in FIGS. 19A and 19B, cavity 70 is encircled by the through-conductor(s) 32 in inductor 33, as illustrated by cavity 70A. In accordance with alternative embodiments, as represented by cavity 70B, cavity 70 is not encircled by inductor 33. In accordance with some exemplary embodiments, there is a plurality of cavities in each package 100, with some cavities (such as 70A) encircled by through-conductors 32, and some others (such as 70B) not encircled by through-conductors 32.

Figure 14B:
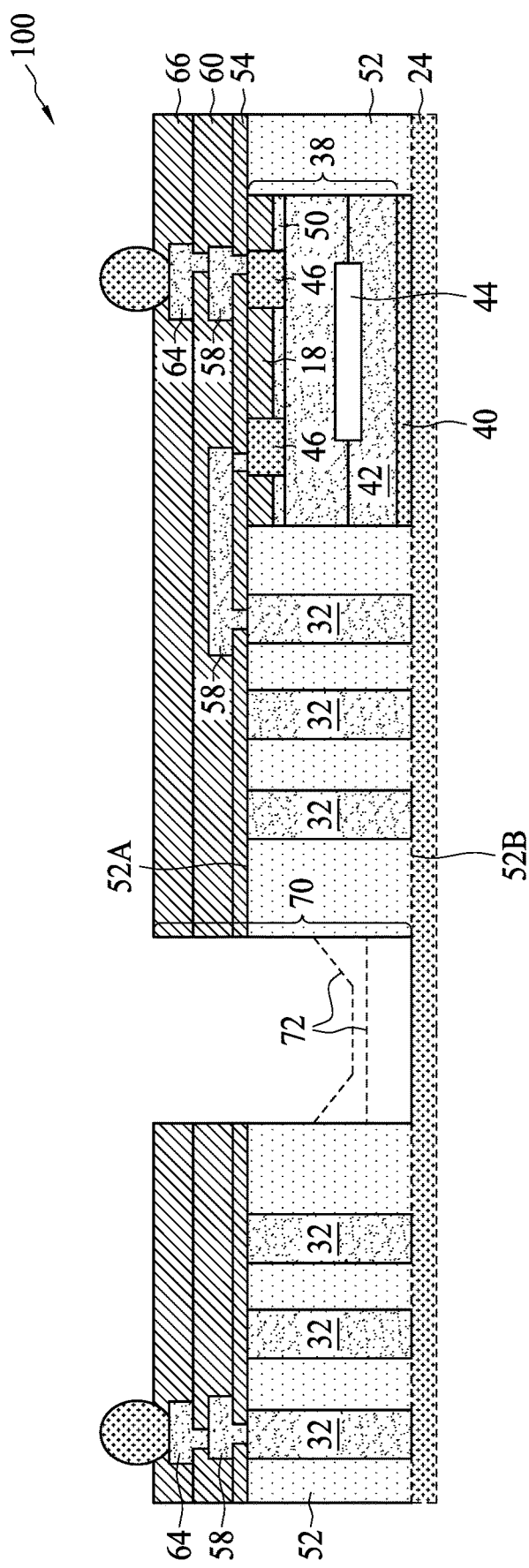

Referring back to FIG. 14A, In accordance with some exemplary embodiments, cavity 70 penetrates through encapsulating material 52, and further penetrates through dielectric layers 54, 60, and 66. Cavity 70 may penetrate through dielectric layer 24, so that cavity 70 forms a through-hole penetrating through the entire package 100. In accordance with some other embodiments, as shown in FIG. 14B, cavity 70 penetrates through encapsulating material 52, while dielectric layer 24 is not penetrated through by cavity 70. In accordance with yet alternative embodiments, cavity 70 penetrates through dielectric layers 54, 60, and 66, and extends to an intermediate level between the top surface 52A and the bottom surface 52B of encapsulating material 52. Dashed lines 72 illustrate the respective bottom surface. Cavity 70 may also have a planar both surface surrounded by slanted bottom surface, as also illustrated by dashed lines 72.

Figure 15:
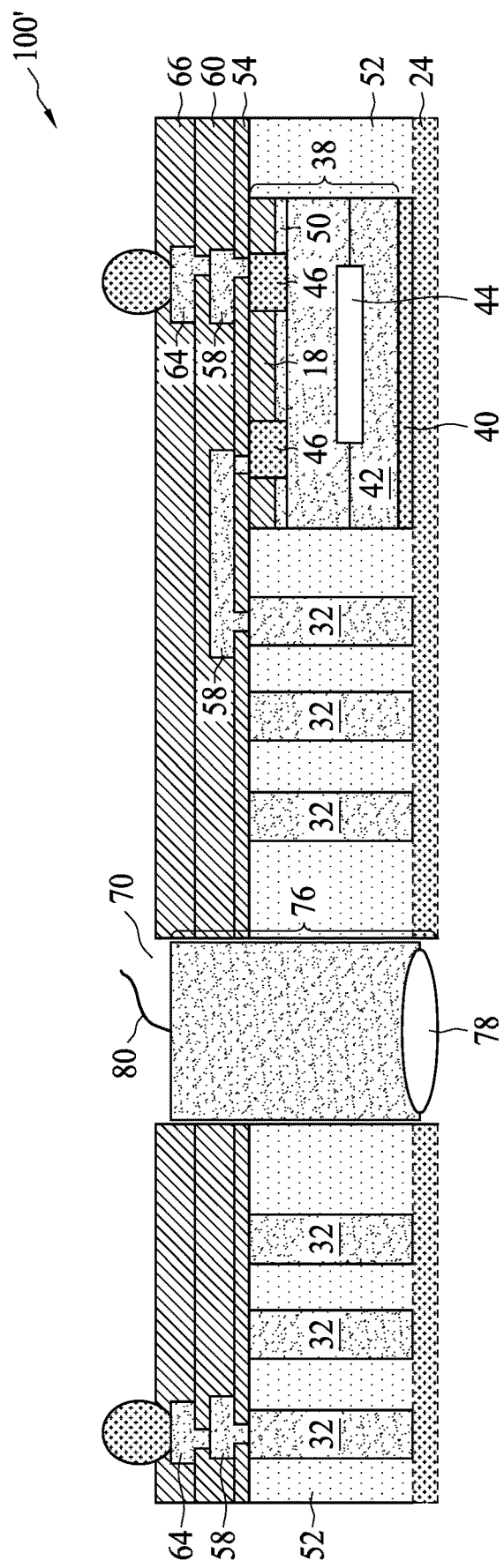

Package 100 is then singulated in accordance with some embodiments of the present disclosure, and package 100 is sawed into a plurality of packages 100' that is identical to each other. FIG. 15 illustrates an exemplary package 100'. In accordance with some exemplary embodiments, component 76 is inserted into cavity 70. The respective step is shown as step 222 in the process flow shown in FIG. 20. In accordance with some exemplary embodiments, as shown in FIG. 15, camera 76, which includes lens 78, is placed in cavity 70. Line 80 represents the electrical wiring of camera 76 in accordance with some embodiments. The mounting mechanism of inserted component 76 in package 100' is not shown, and may be achieved through, for example, adhesion, screwing, or the like. Component 76 may be fixed in cavity 70 without using any fixing component such as adhesive, clamp, and screw. For example, by carefully designing the sizes of cavity 70 and component 76, component 76 may be squeezed into encapsulating material 52, and hence is secured. Alternatively stated, it is possible to remove camera 76 without damaging package 100'. In accordance with some embodiments of the present disclosure, inserted component 76 includes a first portion level with encapsulating material 52, and a second portion level with the overlying dielectric layers 54/60/66. In accordance with alternative embodiments of the present disclosure, an entirety of inserted component 76 is lower than or level with the top surface of encapsulating material 52. Accordingly, inserted component 76 is fully inside encapsulating material 52, and does not include a portion level with the overlying dielectric layers 54/60/66.

Figure 18:
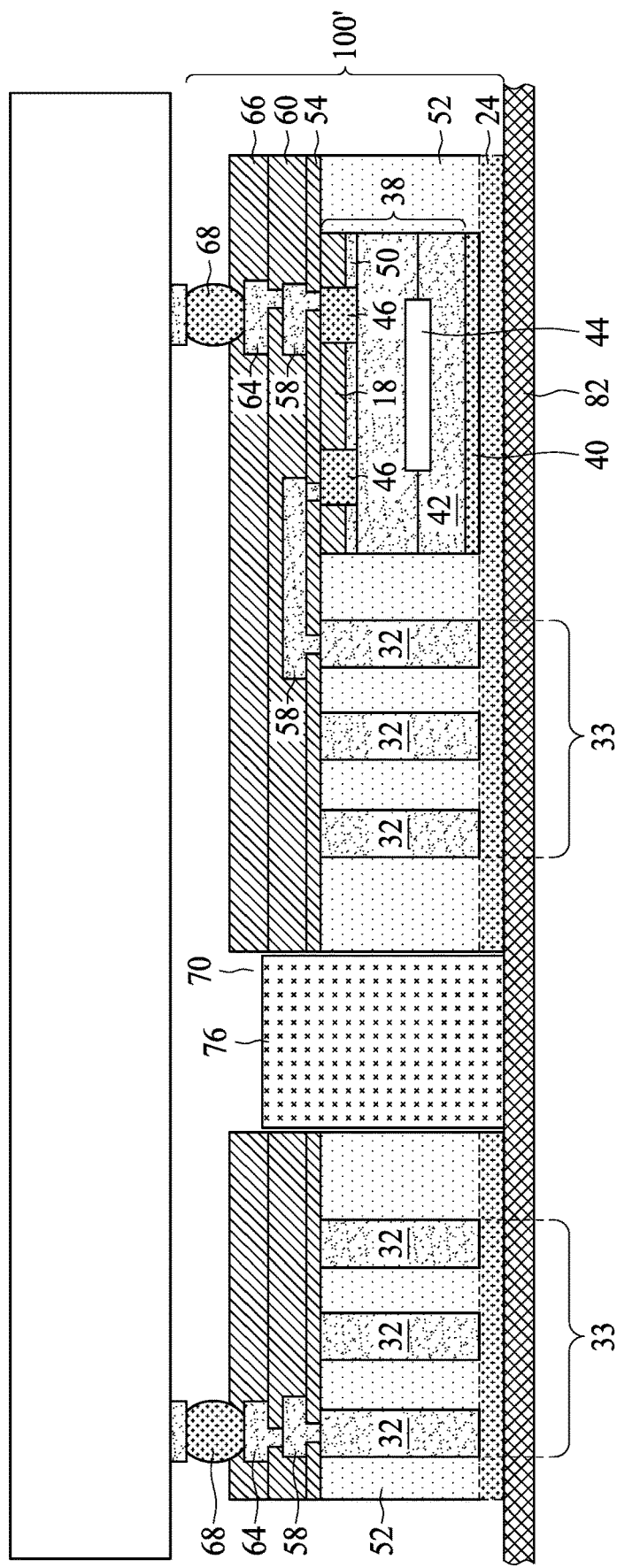
FIG. 18 illustrates a cross-sectional view of a package including a ferrite material inserted into a cavity in accordance with some embodiments.

In accordance with some embodiments, inserted component 76 is a ferrite material, which is also placed into cavity 70, as shown in FIG. 18. Ferrite material 76 in accordance with some embodiments may include manganese-zinc, nickel-zinc, or the like. Ferrite material 76 has comparatively low losses at high frequencies, and is used as the core of inductor 33 (also refer to FIGS. 19A and 19B), which may be a part of a wireless charger or a switched-mode power supply.

Figure 16:
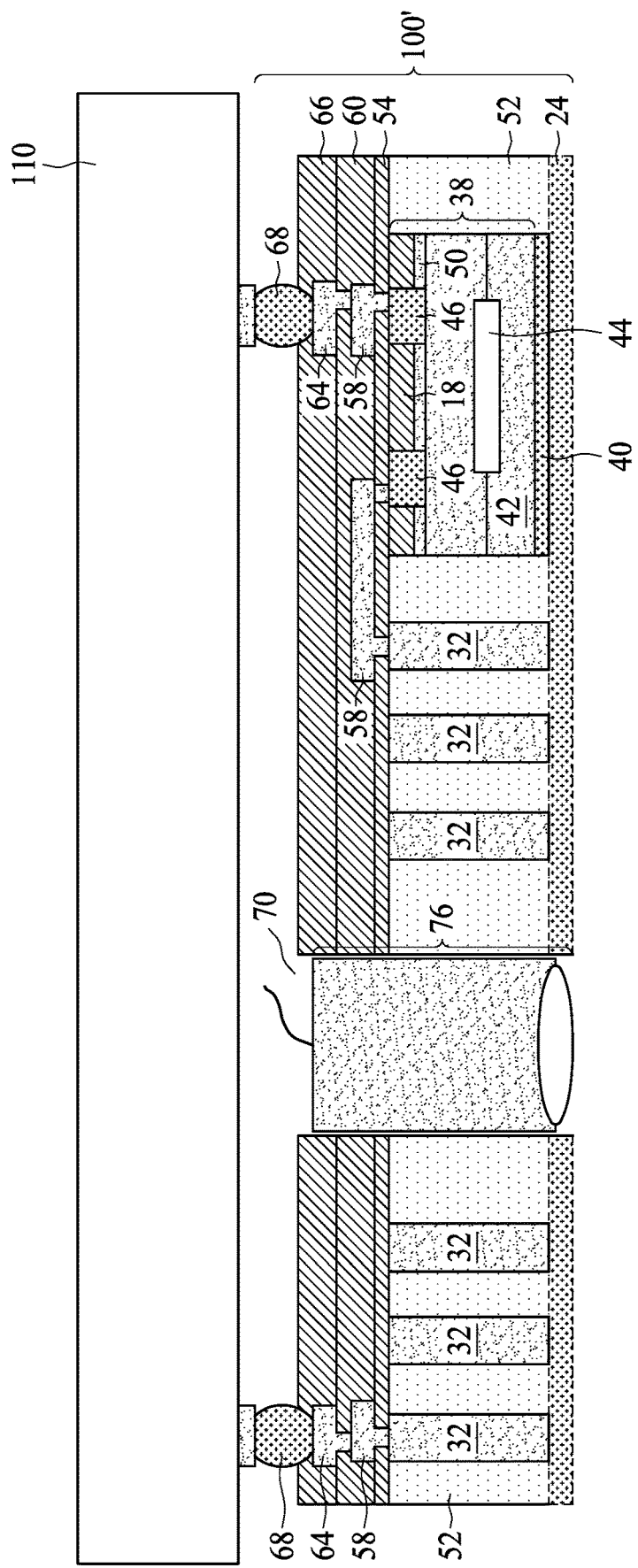
Figure 17:
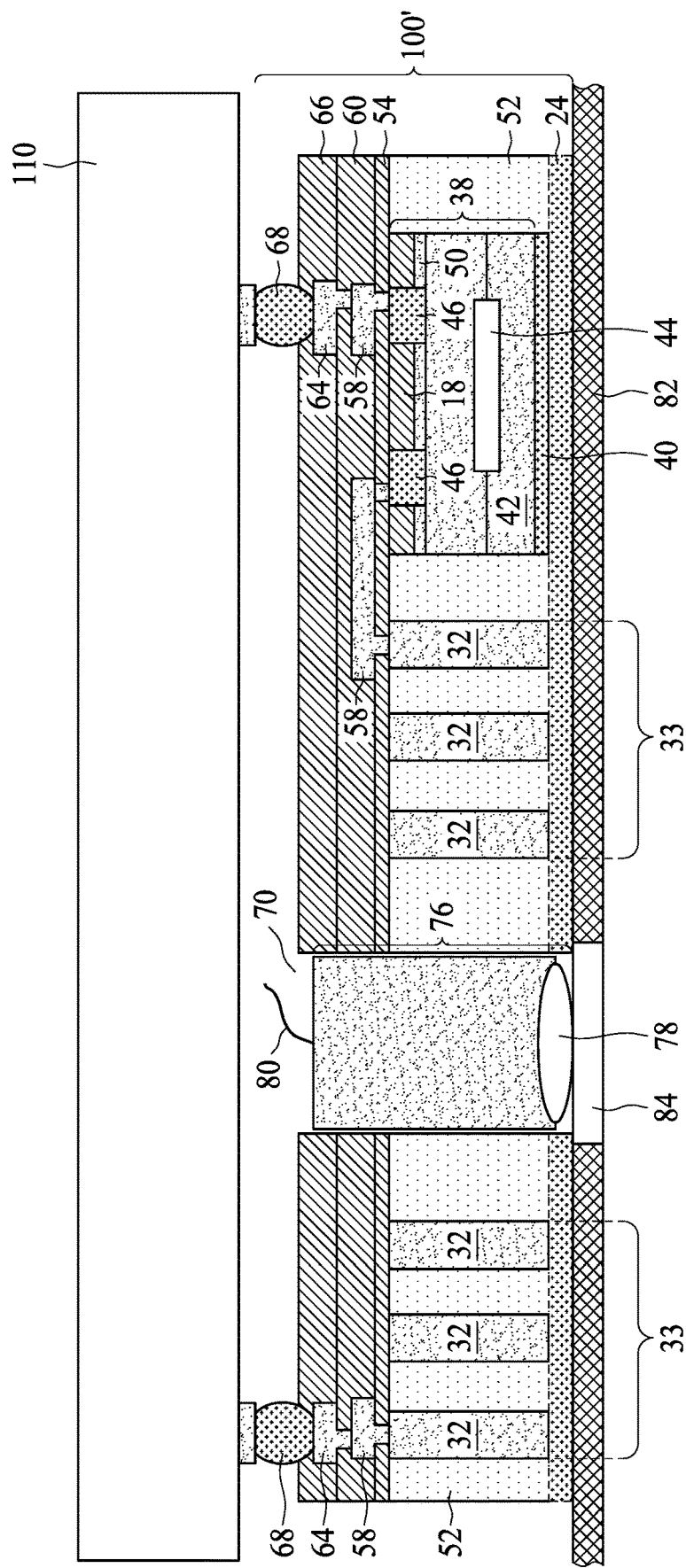

FIGS. 16 and 17 illustrate the assembly process of package 100' in accordance with some exemplary embodiments. The respective step is shown as step 224 in the process flow shown in FIG. 20. FIG. 16 illustrates the bonding of package 100' to package component 110, for example, through electrical connectors 68. Package component 110 may be a Printed Circuit Board (PCB), an interposer, a package substrate, or the like. In accordance with alternative embodiments, package 100' is electrically connected to a flex PCB (not shown), which may overlap cavity 70 and component 76, or connected sideways.

FIG. 17 illustrates a product in which package 100' and package component 110 are placed in casing 82. Casing 82 may be the casing of a cellular phone, a tablet, or a computer, for example. The illustrated portion of casing 82 is a lower part, and casing 82 further includes an upper part overlying, and portions (not shown) on the left and right, of package 100' and package component 110. In accordance with some embodiments of the present disclosure, window 84 is formed to align to camera 76, wherein window 84 is formed of a transparent material such as glass, plastic, or the like. Lens 78 thus may receive the light passing through window 84. Each of component 76 and encapsulating material 52 may be in contact with casing 82, or spaced apart from casing 82 by a small gap.

In the exemplary structure as shown in FIG. 17, inductor 33 is illustrated as an example. In accordance with some embodiments, inductor 33 is not formed, while camera 76 (or any other inserted object) is fixed inside encapsulating material 52.

The embodiments of the present disclosure have some advantageous features. By forming a cavity in the encapsulating material of a package, a component may be inserted into the encapsulating material. Accordingly, the component does not need to protrude beyond the encapsulating material, and hence the thickness of the resulting product is reduced.

In accordance with some embodiments of the present disclosure, a structure includes a device die, and an encapsulating material encapsulating the device die therein. The encapsulating material has a top surface coplanar with a top surface of the device die, and a cavity in the encapsulating material. The cavity penetrates through the encapsulating material.

In accordance with some embodiments of the present disclosure, a package includes a device die, and an encapsulating material encapsulating the device die therein. The encapsulating material has a top surface coplanar with a top surface of the device die. An inductor includes a coil having a portion extending from the top surface to the bottom surface of the encapsulating material. At least one dielectric layer is over the encapsulating material and the portion of the coil. A plurality of redistribution lines is formed in the at least one dielectric layer. The inductor is electrically coupled to the device die through the plurality of redistribution lines. A cavity penetrates through the encapsulating material and the at least one dielectric layer.

In accordance with some embodiments of the present disclosure, a method includes encapsulating a device die in an encapsulating material, planarizing a top surface of the device die with a top surface of the encapsulating material, forming at least one dielectric layer over the encapsulating material and the device die, and forming a plurality of redistribution lines in the at least one dielectric layer. The plurality of redistribution lines is electrically coupled to the device die. A portion of the encapsulating material and the at least one dielectric layer are removed to form a cavity penetrating through the at least one dielectric layer and the encapsulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   encapsulating a device die in an encapsulating material;
   planarizing a top surface of the device die with a top surface of the encapsulating material;
   forming at least one dielectric layer over the encapsulating material and the device die;
   forming a plurality of redistribution lines in the at least one dielectric layer, wherein the plurality of redistribution lines is electrically coupled to the device die; and
   removing a portion of the encapsulating material and the at least one dielectric layer to form a cavity penetrating through the at least one dielectric layer and the encapsulating material.

2. The method of claim 1 further comprising inserting a component into the cavity.

3. The method of claim 2, wherein the inserting the component comprises inserting a camera.

4. The method of claim 2, wherein the inserting the component comprises inserting a ferrite material.

5. The method of claim 1 further comprising:
   forming an inductor with a portion coplanar with the device die, wherein the cavity is formed in a region encircled by the inductor, and after the planarizing, a top surface of the portion of the inductor is revealed.

6. The method of claim 1, wherein the forming the cavity comprises a drilling process selected from drilling using a drill bit, a laser drilling, and a blade cutting.

7. The method of claim 1, wherein the device die and the encapsulating material are parts of a package, and the method further comprises bonding a package component to the package, wherein the package component covers the cavity.

8. A method comprising:
   forming a dielectric buffer layer over a carrier;
   plating a coil over the dielectric buffer layer;
   placing a device die over the dielectric buffer layer;
   encapsulating the coil and the device die in an encapsulating material;
   forming a redistribution line connecting the coil to the device die; and
   forming a through-opening penetrating through the encapsulating material, wherein the forming the through-opening comprises removing a portion of the encapsulating material.

9. The method of claim 8, wherein the portion of the encapsulating material is encircled by the coil.

10. The method of claim 8 further comprising:
    forming at least one dielectric layer over the encapsulating material, wherein the redistribution line is formed in the at least one dielectric layer; and
    removing a portion of the dielectric layer so that the through-opening further extends into the dielectric layer.

11. The method of claim 8, wherein the through-opening is formed through drilling using a drill bit.

12. The method of claim 8, wherein the through-opening is formed through laser drill.

13. The method of claim 8 further comprises inserting a pre-formed discrete component into the through-opening, wherein the pre-formed discrete component is formed before being inserted into the through-opening.

14. The method of claim 13, wherein the inserting the pre-formed discrete component comprises inserting a camera or a ferrite material.

15. The method of claim 8 further comprising bonding a package component over the redistribution line, wherein the package component is electrically coupled to one of the coil and the device die through the redistribution line.

16. A method comprising:
    forming a dielectric buffer layer over a carrier;
    forming a coil over the dielectric buffer layer;
    encapsulating the coil in an encapsulating material;
    forming a plurality of dielectric layers over the coil and the encapsulating material;
    demounting the dielectric buffer layer, the coil, and the encapsulating material from the carrier to form a package;
    forming an opening in the package, wherein the opening extends into the plurality of dielectric layers and the encapsulating material; and
    inserting a discrete device into the opening.

17. The method of claim 16, wherein the opening is formed by removing portions of the plurality of dielectric layers and the encapsulating material in a common process.

18. The method of claim 16, wherein the discrete device comprises a first portion at a same level as the encapsulating material, and a second portion level with one of the plurality of dielectric layers.

19. The method of claim 16 further comprising bonding a package component to the package, wherein the package component overlaps the discrete device.

20. The method of claim 16, wherein the discrete device is encircled by the coil.

* * * * *